(12) United States Patent
Mino et al.

(10) Patent No.: US 9,843,163 B2
(45) Date of Patent: Dec. 12, 2017

(54) ULTRAVIOLET LIGHT EMITTING ELEMENT AND ELECTRICAL DEVICE USING SAME

(71) Applicant: PANASONIC CORPORATION, Osaka (JP)

(72) Inventors: Takuya Mino, Osaka (JP); Takayoshi Takano, Saitama (JP); Norimichi Noguchi, Osaka (JP); Kenji Tsubaki, Osaka (JP); Jun Sakai, Tokyo (JP); Hideki Hirayama, Saitama (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/300,460

(22) PCT Filed: Mar. 26, 2015

(86) PCT No.: PCT/JP2015/001732
§ 371 (c)(1),
(2) Date: Sep. 29, 2016

(87) PCT Pub. No.: WO2015/151471
PCT Pub. Date: Oct. 8, 2015

(65) Prior Publication Data
US 2017/0110852 A1 Apr. 20, 2017

(30) Foreign Application Priority Data
Mar. 31, 2014 (JP) .................. 2014-073825

(51) Int. Cl.
*H01S 5/343* (2006.01)
*H01S 5/02* (2006.01)

(52) U.S. Cl.
CPC ........ *H01S 5/34346* (2013.01); *H01S 5/0213* (2013.01); *H01S 5/34333* (2013.01)

(58) Field of Classification Search
CPC . H01S 5/34346; H01S 5/34333; H01S 5/0213
See application file for complete search history.

(56) References Cited

U.S. PATENT DOCUMENTS

| 2002/0150136 A1* | 10/2002 | Watanabe | H01S 5/32341 372/46.011 |
| 2010/0148145 A1* | 6/2010 | Ishibashi | B82Y 20/00 257/13 |
| 2012/0099613 A1* | 4/2012 | Behfar | H01S 5/10 372/45.01 |

FOREIGN PATENT DOCUMENTS

| JP | 06-283825 A | 10/1994 |
| JP | 2002-324913 A | 11/2002 |

(Continued)

OTHER PUBLICATIONS

International Search Report issued in Patent Application No. PCT/JP2015/001732, dated Jun. 16, 2015, along with an English translation thereof.

*Primary Examiner* — Xinning Niu
(74) *Attorney, Agent, or Firm* — Greenblum & Bernstein, P.L.C.

(57) ABSTRACT

An ultraviolet light emitting element includes a light emitting layer, a cap layer, an electron barrier layer. The light emitting layer has a multi-quantum well structure including barrier layers each including a first AlGaN layer and well layers each including a second AlGaN layer. The electron barrier layer includes at least one first p-type AlGaN layer and at least one second p-type AlGaN layer. The cap layer is located between the first p-type AlGaN layer and one of the well layers closest to the first p-type AlGaN layer. The cap layer is a third AlGaN layer having an Al composition ratio greater than an Al composition ratio of each of the well layers and less than an Al composition ratio of the first (Continued)

p-type AlGaN layer. The cap layer has a thickness of greater than or equal to 1 nm and less than or equal to 7 nm.

17 Claims, 7 Drawing Sheets

(56) References Cited

FOREIGN PATENT DOCUMENTS

| JP | 2006-229242 A | 8/2006 |
| JP | 2006-261358 A | 9/2006 |
| JP | 2010-235318 A | 10/2010 |
| JP | 2011-138891 A | 7/2011 |
| JP | 2011-187591 A | 9/2011 |
| JP | 2012-44120 A | 3/2012 |
| JP | 2013-214700 A | 10/2013 |

* cited by examiner

ULTRAVIOLET LIGHT EMITTING ELEMENT AND ELECTRICAL DEVICE USING SAME

TECHNICAL FIELD

The present invention relates to an ultraviolet light emitting element configured to emit ultraviolet light and an electrical device including the ultraviolet light emitting element.

BACKGROUND ART

As such an ultraviolet light emitting element, for example, a gallium nitride-based compound semiconductor laser diode including a sapphire substrate has been known (JP H06-283825 A).

In the gallium nitride-based compound semiconductor laser diode, Mg diffused from a Mg-doped p-type $Al_YGa_{1-Y}N$ layer is absorbed into an undoped $Al_XGa_{1-X}N$ layer, thereby inhibiting Mg diffusion. Note that the relationship between X and Y is $0 \leq X \leq Y \leq 1$.

SUMMARY OF INVENTION

Technical Problem

In the field of ultraviolet light emitting elements, there is a demand for increasing the light emission efficiency.

In view of the foregoing, it is an object of the present invention to provide an ultraviolet light emitting element whose light emission efficiency can be increased and an electrical device including the ultraviolet light emitting element.

Solution to Problem

An ultraviolet light emitting element of the present invention includes a sapphire substrate, an n-type AlGaN layer, a light emitting layer, a cap layer, an electron barrier layer, and a p-type contact layer including a p-type GaN layer. The light emitting layer has a multi-quantum well structure. The multi-quantum well structure includes a plurality of barrier layers each being a first AlGaN layer and a plurality of well layers each being a second AlGaN layer. The electron barrier layer includes at least one first p-type AlGaN layer having an Al composition ratio higher than an Al composition ratio of each of the barrier layers and at least one second p-type AlGaN layer having an Al composition ratio higher than an Al composition ratio of each of the plurality of well layers and lower than the Al composition ratio of the at least one first p-type AlGaN layer. The at least one first p-type AlGaN layer and the at least one second p-type AlGaN layer contain Mg. The cap layer is located between one well layer of the plurality of well layers of the multi-quantum well structure and the at least one first p-type AlGaN layer, the one well layer being closest to the at least one first p-type AlGaN layer. The cap layer is a third AlGaN layer having an Al composition ratio higher than the Al composition ratio of each of the plurality of well layers and lower than the Al composition ratio of the at least one first p-type AlGaN layer. The cap layer has a thickness of greater than or equal to 1 nm and less than or equal to 7 nm.

An electrical device of the present invention includes the above-described ultraviolet light emitting element and a device body.

DESCRIPTION OF EMBODIMENTS

Figure 1:
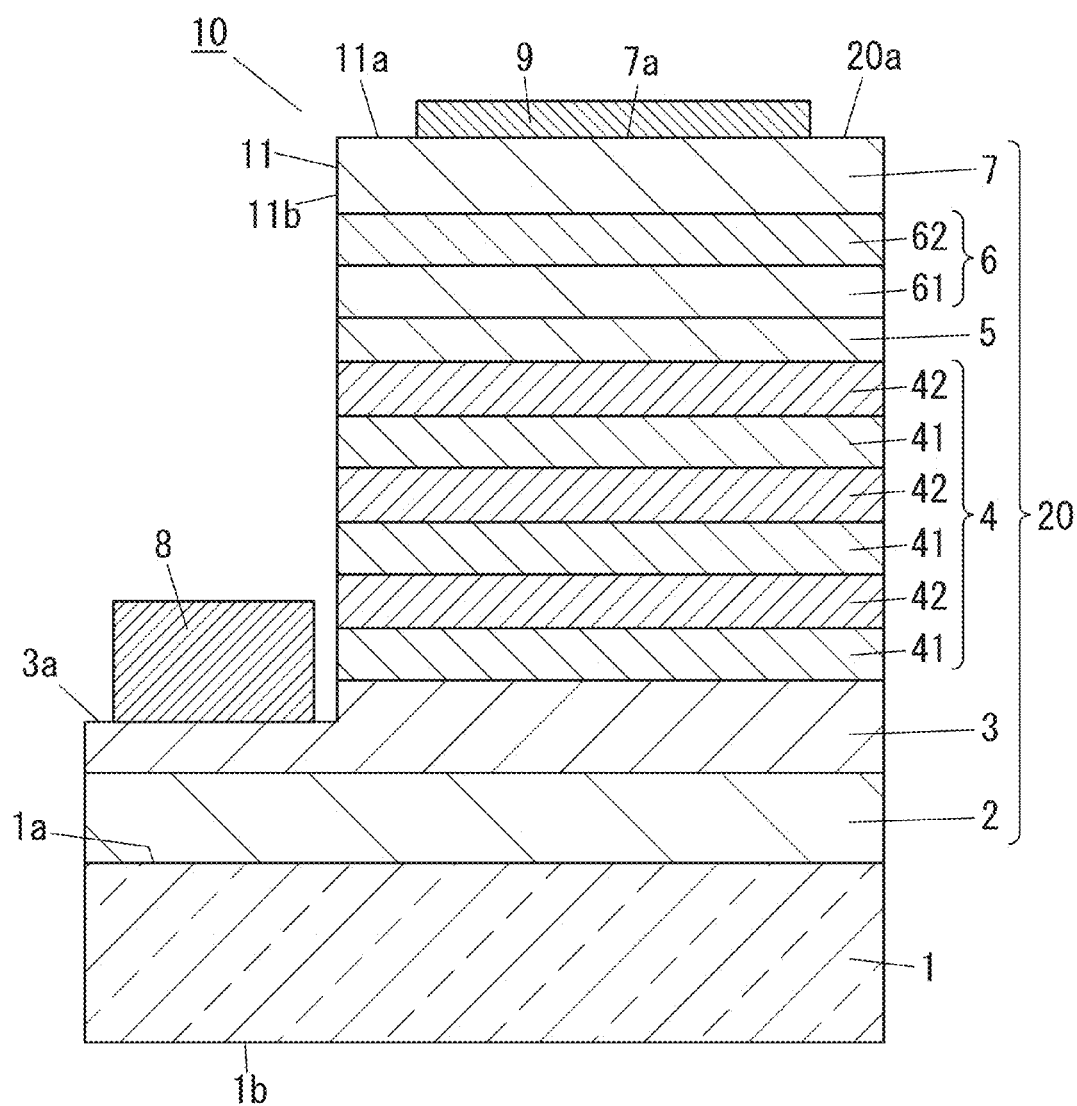
FIG. 1 is a sectional view schematically illustrating an ultraviolet light emitting element of an embodiment.

An ultraviolet light emitting element 10 of the present embodiment will be described below with reference to FIGS. 1 to 3.

The ultraviolet light emitting element 10 includes a sapphire substrate 1, an n-type AlGaN layer 3, a light emitting layer 4, a cap layer 5, an electron barrier layer 6, and a p-type contact layer 7 including a p-type GaN layer. The light emitting layer 4 has a multi-quantum well structure. The multi-quantum well structure includes a plurality of barrier layers 41 each being a first AlGaN layer and a plurality of well layers 42 each being a second AlGaN layer. The electron barrier layer 6 includes a first p-type AlGaN layer 61 and a second p-type AlGaN layer 62. The first p-type AlGaN layer 61 and the second p-type AlGaN layer 62 contain Mg. The cap layer 5 is located between one of the plurality of well layers 42 of the multi-quantum well structure and the first p-type AlGaN layer 61, the one well layer 42 being closest to the first p-type AlGaN layer 61. The cap layer 5 is a third AlGaN layer having an Al composition ratio higher than an Al composition ratio of the second AlGaN layer and lower than an Al composition ratio of the first p-type AlGaN layer 61. The cap layer 5 has a thickness of greater than or equal to 1 nm and less than or equal to 7 nm. Thus, the light emission efficiency of the ultraviolet light emitting element 10 can be increased. In the present specification, the composition ratio represents a value obtained by a composition analysis by Energy Dispersive X-ray Spectroscopy (EDX). In discussions as to the relative relationship in the magnitude of the composition ratio, the composition ratio may represent a value obtained by a composition analysis by, for example, Auger Electron Spectroscopy other than the EDX.

The ultraviolet light emitting element 10 has a mesa structure 11. The mesa structure 11 is formed by partly etching a multilayer structure 20 including the n-type AlGaN layer 3, the light emitting layer 4, the cap layer 5, the electron barrier layer 6, and the p-type contact layer 7 part way into the n-type AlGaN layer 3 from a surface 20a of the multilayer structure 20. In the multilayer structure 20 including the n-type AlGaN layer 3, the light emitting layer 4, the cap layer 5, the electron barrier layer 6, and the p-type contact layer 7, the n-type AlGaN layer 3, the light emitting layer 4, the cap layer 5, the electron barrier layer 6, and the p-type contact layer 7 are arranged in this order from a side close to the sapphire substrate 1. The ultraviolet light emitting element 10 has a surface 7a of the p-type contact layer 7, the surface 20a of the multilayer structure 20, and an upper surface 11a of the mesa structure 11 which are an identical surface. The ultraviolet light emitting element 10 includes a first electrode 8 formed on a surface 3a of the n-type AlGaN layer 3 and a second electrode 9 formed on the surface 7a of the p-type contact layer 7. The first electrode 8 is electrically connected to the n-type AlGaN layer 3. The second electrode 9 is electrically connected to the p-type contact layer 7. The ultraviolet light emitting element 10 includes a negative electrode (also referred to as an "n electrode") formed by the first electrode 8. The ultraviolet light emitting element 10 includes a positive electrode (also referred to as a "p electrode") formed by the second electrode 9.

The ultraviolet light emitting element 10 preferably includes an insulative film extending over part of the upper surface 11a of the mesa structure 11, a side surface 11b of the mesa structure 11, and part of the surface 3a of the n-type AlGaN layer 3. As a material of the insulative film, for example, $SiO_2$, or the like can be used.

Each component of the ultraviolet light emitting element 10 will be described in more detail below.

The ultraviolet light emitting element 10 can be an ultraviolet light-emitting diode configured to emit ultraviolet light having an emission peak wavelength in an ultraviolet wavelength range of 210 nm to 360 nm. In this case, the ultraviolet light emitting element 10 can be utilized in the field of, for example, a high efficiency white lighting application, a sterilization application, a medical application, an application of high-speed processing of environmental pollutants, and other applications. When the ultraviolet light emitting element 10 is utilized in the field of sterilization, each of the well layers 42 of the light emitting layer 4 preferably emits ultraviolet light having an emission peak wavelength within an ultraviolet wavelength range from 260 nm to 285 nm. With this configuration, the ultraviolet light emitting element 10 can emit ultraviolet light in the range of 260 nm to 285 nm readily absorbable in DNA of viruses and/or bacteria, thereby effectively performing sterilization.

The chip size of the ultraviolet light emitting element 10 is, but is not limited to, 400 μm□ (400 μm×400 μm). The chip size can be accordingly set within the range of for example, about 200 μm□ (200 μm×200 μm) to about 1 mm□ (1 mm×1 mm). The planar shape of the ultraviolet light emitting element 10 is not limited to a square shape but may be, for example, a rectangular shape, or the like. When the planar shape of the ultraviolet light emitting element 10 is a rectangular shape, the chip size of the ultraviolet light emitting element 10 can be, for example, 500 μm×240 μm.

The multilayer structure 20 including the n-type AlGaN layer 3, the light emitting layer 4, the cap layer 5, the electron barrier layer 6, and the p-type contact layer 7 can be formed by an epitaxial growth method. As the epitaxial growth method, for example, a metal organic vapor phase epitaxy (MOVPE) method is preferably used, and a low-pressure MOVPE method is more preferably used. The epitaxial growth method is not limited to the MOVPE method, but, for example, a hydride vapor phase epitaxy (HVPE) method, a molecular beam epitaxy (MBE) method, or the like may be used.

For example, the sapphire substrate 1 has a first surface 1a which is preferably the (0001) plane, that is, the c-plane. The sapphire substrate 1 preferably has an off-angle of 0° to 0.3° from the (0001) plane. The first surface 1a of the sapphire substrate 1 is not limited to the c-plane, but can be, for example, the m-plane, the a-plane, the R-plane, or the like. The sapphire substrate 1 of the ultraviolet light emitting element 10 has a second surface 1b serving as a light extraction surface through which ultraviolet light is output.

The ultraviolet light emitting element 10 preferably includes a buffer layer 2 disposed between the sapphire substrate 1 and the n-type AlGaN layer 3. That is, in the ultraviolet light emitting element 10, the n-type AlGaN layer 3 is preferably formed to face the first surface 1a of the sapphire substrate 1 with the buffer layer 2 provided between the n-type AlGaN layer 3 and the sapphire substrate 1. When the ultraviolet light emitting element 10 includes the buffer layer 2, the multilayer structure 20 includes the buffer layer 2.

The buffer layer 2 may include an $Al_xGa_{1-x}N$ layer (0<x≤1). The buffer layer 2 is provided in order to reduce threading dislocations. In the buffer layer 2, the full width at half maximum of an X-Ray Rocking Curve (XRC) obtained by ω scan X-ray diffraction on the (10-12) plane of the $Al_xGa_{1-x}N$ layer (0<x≤1) is preferably less than or equal to 400 arcsec. Thus, the dislocation density of the ultraviolet light emitting element 10 can be reduced to or below $3×10^{19}$ $cm^{-2}$, thereby improving the light emission efficiency. The dislocation density is the number of threading dislocations per unit area and is a value obtained from a cross-sectional TEM image.

In the ultraviolet light emitting element 10, the buffer layer 2 preferably has band gap energy greater than band gap energy of each of the plurality of well layers 42. With this configuration, absorption of ultraviolet light emitted from the light emitting layer 4 by the buffer layer 2 can be reduced, and thus, the light extraction efficiency of the ultraviolet light emitting element 10 can be increased. In the ultraviolet light emitting element 10, the buffer layer 2 is more preferably an AlN layer. With this configuration, since the buffer layer 2 includes an AlN layer having a greatest band gap energy among $Al_xGa_{1-x}N$ layers (0<x≤1), the absorption of the ultraviolet light emitted from the light emitting layer 4 by the buffer layer 2 can further be reduced in the ultraviolet light emitting element 10.

When the thickness of the buffer layer 2 is too small, a reduction in threading dislocation is likely to be insufficient, and the flatness of the surface is likely to be insufficient as an underlying layer of the n-type AlGaN layer. When the thickness of the buffer layer 2 is too large, the too large thickness may cause formation of a crack due to a lattice mismatch, peel-off of the buffer layer 2, and/or a too large warp of a wafer on which a plurality of ultraviolet light emitting elements 10 are to be formed. Therefore, the thickness of the buffer layer 2 is preferably greater than or equal to 3 μm and less than or equal to 6 μm. The thickness of the buffer layer 2 may be, for example, 4 μm.

Figure 3:
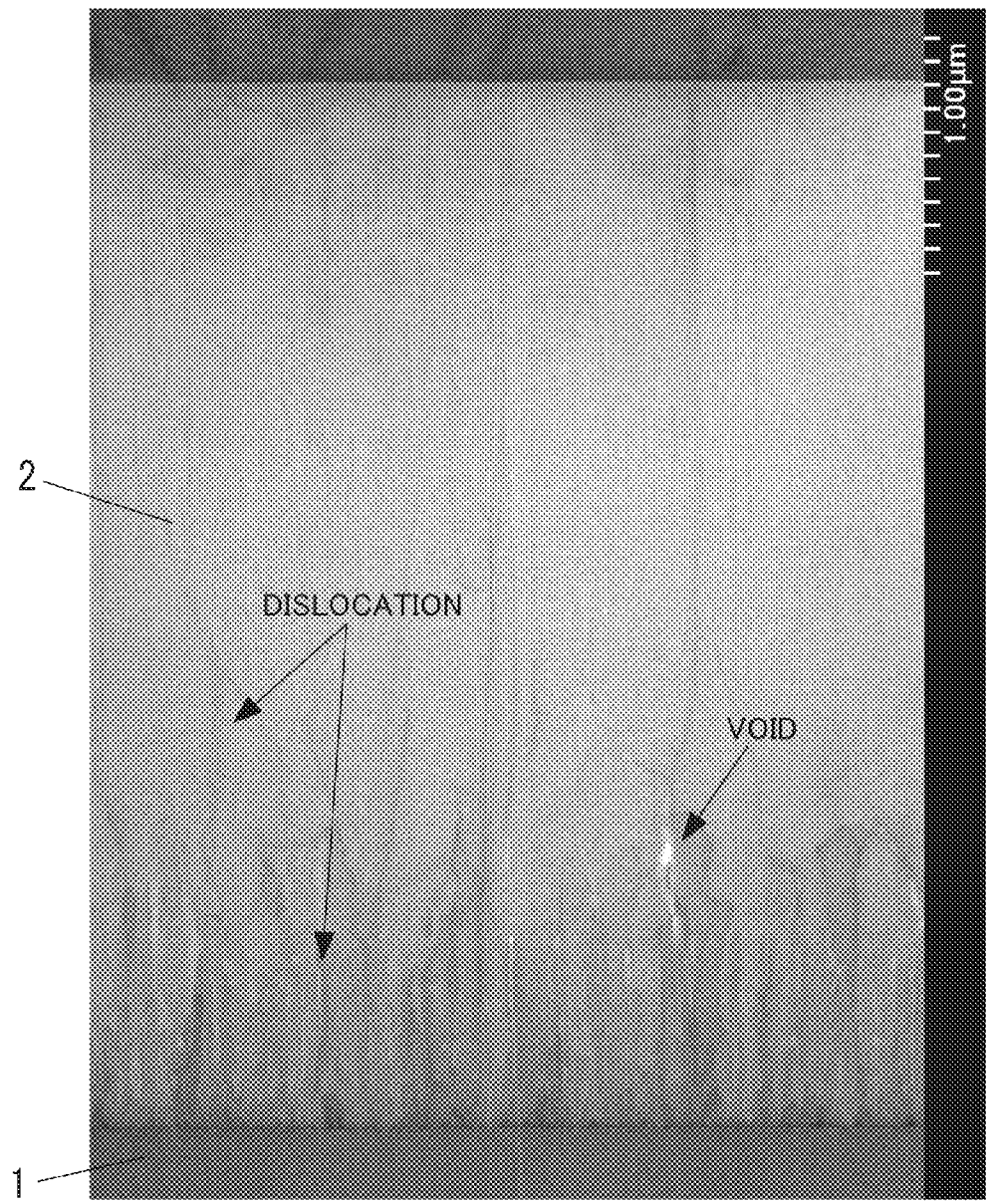
FIG. 3 is a cross-sectional transmission electron microscope (TEM) image of the ultraviolet light emitting element of the embodiment.

The ultraviolet light emitting element 10 preferably has a void (see the cross-sectional transmission electron microscope image of FIG. 3) in the buffer layer 2. Since the void exists in the buffer layer 2 of the ultraviolet light emitting element 10, the crystallinity of the buffer layer 2 can be improved, and the crystallinity of the light emitting layer 4, and the like can be improved. This can improve the light emission efficiency of the ultraviolet light emitting element 10. The void in the buffer layer 2 probably has a function of reducing threading dislocations in the buffer layer 2 by eliminating threading dislocations extending from the interface between the sapphire substrate 1 and the buffer layer 2 or by bending and reducing the threading dislocations extending from the interface between the sapphire substrate 1 and the buffer layer 2 when the buffer layer 2 is formed. Moreover, the void in the buffer layer 2 probably has a function of reducing formation of cracks in the buffer layer 2 and/or the warp of the buffer layer 2 by reducing tensile stress caused in the buffer layer 2 due to, for example, the difference in thermal expansion coefficient between sapphire and AlGaN when the buffer layer 2 is formed.

The void preferably exists in an area up to 2 μm in the thickness direction of the buffer layer 2 from the interface between the sapphire substrate 1 and the buffer layer 2. With this configuration, it is possible to improve the flatness of the surface of the buffer layer 2 of the ultraviolet light emitting element 10. In the ultraviolet light emitting element 10, for example, when the buffer layer 2 is an AlN layer, the difference in lattice constant between AlN and sapphire is large, i.e., greater than or equal to 10%. Therefore, when the buffer layer 2 is grown, the buffer layer 2 three-dimensionally grows in an initial stage of the growth. In the ultraviolet light emitting element 10, the void is formed in the buffer layer 2 probably because adjacent AlN crystals join to each other at the time when the growth thickness of the buffer layer 2 exceeds 2 μm during the growth of the buffer layer 2 to make surfaces flat.

The n-type AlGaN layer 3 is a layer configured to transport electrons to the light emitting layer 4. The composition ratio of the n-type AlGaN layer 3 is preferably set such that ultraviolet light emitted from the light emitting layer 4 can be efficiently output. For example, when the Al composition ratio of each well layer 42 is 0.45 and the Al composition ratio of each barrier layer 41 is 0.6, the Al composition ratio of the n-type AlGaN layer 3 can be 0.6 which is equal to the Al composition ratio of each barrier layer 41. The Al composition ratio of the n-type AlGaN layer 3 may be equal to or different from the Al composition ratio of each barrier layer 41.

The Al composition ratio of the n-type AlGaN layer 3 is preferably greater than or equal to 0.50 and less than or equal to 0.70. In the ultraviolet light emitting element 10, when the Al composition ratio of the n-type AlGaN layer 3 is less than 0.50, ultraviolet light of 260 nm to 285 nm emitted from the light emitting layer 4 is absorbed by the n-type AlGaN layer 3, which may reduce the light extraction efficiency. Moreover, in the ultraviolet light emitting element 10, when the Al composition ratio of the n-type AlGaN layer 3 is greater than 0.70, the composition difference between the n-type AlGaN layer 3 and the light emitting layer 4 designed to emit the ultraviolet light of 260 nm to 285 nm becomes large, so that a defect is more likely to be caused in the light emitting layer 4.

The n-type AlGaN layer 3 preferably contains Si as a donor impurity, a doping concentration of the Si in the n-type AlGaN layer 3 being greater than or equal to $5\times10^{18}$ cm$^{-3}$ and less than or equal to $5\times10^{19}$ cm$^{-3}$. In the ultraviolet light emitting element 10, when the doping concentration of Si in the n-type AlGaN layer 3 is less than $5\times10^{18}$ cm$^{-3}$, an ohmic contact between the first electrode 8 and the n-type AlGaN layer 3 may no longer be formed or the ohmic characteristics of the ohmic contact may degrade. Moreover, in the ultraviolet light emitting element 10, when the doping concentration of Si in the n-type AlGaN layer 3 is greater than $5\times10^{19}$ cm$^{-3}$, the crystallinity of the n-type AlGaN layer 3 may degrade. The doping concentration of Si in the n-type AlGaN layer 3 can be measured by, for example, secondary ion mass spectroscopy (SIMS) analysis.

The thickness of the n-type AlGaN layer 3 is preferably greater than or equal to 1 μm and less than or equal to 3 μm. In the ultraviolet light emitting element 10, when the thickness of the n-type AlGaN layer 3 is less than 1 μm, a current path in the n-type AlGaN layer 3 becomes narrow, which may increase a drive voltage. Moreover, in the ultraviolet light emitting element 10, when the thickness of the n-type AlGaN layer 3 is greater than 3 μm, strain accumulated in the n-type AlGaN layer 3 may form cracks.

Note that the structure of the n-type AlGaN layer 3 is not limited to the single layer structure but may have, for example, a layered structure including a plurality of n-type AlGaN layers having Al composition ratios different from each other.

The light emitting layer 4 is configured to emit light by recombination of two types of carriers (electrons and holes) injected into each well layer 42.

The emission peak wavelength of the light emitting layer 4 can be set to an arbitrary emission peak wavelength within the range of 210 nm to 360 nm by changing the Al composition ratio of the second AlGaN layer, which is the well layer 42. That is, the light emitting layer 4 includes the well layer 42 configured to emit ultraviolet light having an emission peak wavelength within the range of 210 nm to 360 nm. For example, when a desired emission peak wavelength is about 265 nm, the Al composition ratio of the second AlGaN layer may be set to 0.50.

In the ultraviolet light emitting element 10, the thickness of each barrier layer 41 and the thickness of each well layer 42 are, for example, 10 nm and 2 nm, respectively but are not limited to these values.

Each of the barrier layers 41 preferably has a thickness of greater than or equal to 2 nm and less than or equal to 20 nm. The light emission efficiency of the ultraviolet light emitting element 10 may decrease when the thickness of the barrier layer 41 is less than 2 nm probably because the carrier confinement effect of confining carries in the well layers 42 by the barrier layer 41 is reduced, and thus, the carriers tend to easily escape from the well layers 42. Moreover, in the ultraviolet light emitting element 10, when the thickness of the barrier layer 41 is greater than 20 nm, carriers may not be injected into the well layers 42.

Each of the barrier layers 41 is preferably doped with Si, a concentration of the Si being greater than or equal to $5\times10^{17}$ cm$^{-3}$ and less than or equal to $5\times10^{18}$ cm$^{-3}$. With this configuration, strain due to piezoelectric field caused by a lattice mismatch can be alleviated, and therefore, the light emission efficiency of the ultraviolet light emitting element 10 can be increased. In the ultraviolet light emitting element 10, when the concentration of Si in each barrier layer 41 is less than $5\times10^{17}$ cm$^{-3}$, the effect of alleviating the strain caused by the piezoelectric field may be reduced. Moreover, in the ultraviolet light emitting element 10, when the concentration of Si in each barrier layer 41 is greater than $5\times10^{18}$ cm$^{-3}$, the crystallinity of each barrier layer 41 tends to be degraded. The concentration of Si in each barrier layer 41 can be measured by, for example, the SIMS analysis.

Each of the plurality of well layers 42 preferably has a thickness of greater than or equal to 0.5 nm and less than or equal to 3 nm. When the thickness of each well layer 42 is less than 0.5 nm, the light emission efficiency of the ultraviolet light emitting element 10 tends to decrease. This is probably because the carrier confinement effect of the light emitting layer 4 is reduced when the thickness of each well layer 42 is less than 0.5 nm. When the thickness of the well layer 42 is greater than 3 nm, the light emission efficiency of the ultraviolet light emitting element 10 tends to decrease. This is probably because the carrier confinement effect of the light emitting layer 4 is reduced when the thickness of each well layer 42 is greater than 3 nm, so that the injected carriers tend to easily escape from the well layers 42 before recombination of electrons and holes as the carriers injected into the well layers 42.

The electron barrier layer 6 is a layer to suppress one or more of the electrons having been injected into the light emitting layer 4 but not having been recombined with one or more holes in the light emitting layer 4 from escaping (overflowing) toward the p-type contact layer 7. That is, the electron barrier layer 6 is configured to serve as an electron blocking layer for blocking electrons from the light emitting layer 4. The Al composition ratio of the first p-type AlGaN layer 61 is set such that the band gap energy of the first p-type AlGaN layer 61 is higher than the band gap energy of each barrier layer 41. In the ultraviolet light emitting element 10, the first p-type AlGaN layer 61 has a band gap energy of 6.1 eV and an Al composition ratio of 0.95, and the second p-type AlGaN layer 62 has a band gap energy of 5.0 eV and an Al composition ratio of 0.60, but the band gap energies and the Al composition ratios are not limited to these values.

As described above, the first p-type AlGaN layer 61 and the second p-type AlGaN layer 62 contain Mg. Thus, the acceptor impurity of the first p-type AlGaN layer 61 and the second p-type AlGaN layer 62 is Mg.

The thickness of the first p-type AlGaN layer 61 can be set to, for example, 20 nm. The thickness of the first p-type AlGaN layer 61 is not particularly limited but when the thickness is too small, the effect of suppressing the overflow is reduced, and when the thickness is too large, the resistance of the ultraviolet light emitting element 10 is increased. The thickness of the first p-type AlGaN layer 61 can be set within the range of, for example, 7 nm to 24 nm.

The second p-type AlGaN layer 62 is configured to also serve as a layer for transporting holes to the light emitting layer 4. The composition ratio of the second p-type AlGaN layer 62 is preferably set such that absorption of ultraviolet light emitted from the light emitting layer 4 can be reduced. When each well layer 42 has an Al composition ratio of 0.45 and each barrier layer 41 has an Al composition ratio of 0.60, the Al composition ratio of the second p-type AlGaN layer 62 can be, for example, 0.6. That is, when the second AlGaN layer, which is the well layer 42, is an $Al_{0.45}Ga_{0.55}N$ layer, the second p-type AlGaN layer 62 can be a p-type $Al_{0.60}Ga_{0.40}N$ layer. The Al composition ratio of the second p-type AlGaN layer 62 may be the same as or different from the Al composition ratio of each barrier layer 41.

The hole concentration of the second p-type AlGaN layer 62 is not particularly limited, but a higher concentration within a hole concentration range within which the layer quality of the second p-type AlGaN layer 62 does not degrade is preferable.

The thickness of the second p-type AlGaN layer 62 can be set to, for example, 20 nm. The thickness of the second p-type AlGaN layer 62 is not particularly limited. However, in the ultraviolet light emitting element 10, it is difficult to realize the hole concentration of the second p-type AlGaN layer 62 to be greater than or equal to the electron concentration of the n-type AlGaN layer 3, and when the thickness of the second p-type AlGaN layer 62 is too large, the resistance of the ultraviolet light emitting element 10 is too high. Thus, the thickness of the second p-type AlGaN layer 62 is preferably less than or equal to 200 nm and more preferably less than or equal to 100 nm.

The cap layer 5 is a diffusion prevention layer for suppressing impurities in the electron barrier layer 6 from diffusing into the light emitting layer 4. Examples of the impurities in the electron barrier layer 6 include an acceptor impurity of the electron barrier layer 6. The acceptor impurity of the electron barrier layer 6 is the acceptor impurity of the first p-type AlGaN layer 61 and the second p-type AlGaN layer 62, and is more specifically Mg.

In the ultraviolet light emitting element 10, the Al composition ratio of the third AlGaN layer included in the cap layer 5 is set to 0.60. The Al composition ratio of the third AlGaN layer is not limited to 0.60 but may be greater than the Al composition ratio of each well layer 42 and less than the Al composition ratio of the first p-type AlGaN layer 61. The thickness of the cap layer 5 can be set to, for example, 5 nm.

The p-type contact layer 7 is a layer to establish a good ohmic contact with the second electrode 9.

The thickness of the p-type contact layer 7 is set to, but is not limited to, 400 nm and is preferably greater than or equal to 10 nm and less than or equal to 500 nm. In the ultraviolet light emitting element 10, when the thickness of the p-type contact layer 7 is less than 10 nm, in-plane uniformity of the thickness of the p-type contact layer 7 tends to decrease and/or in-plane variations of the electrical characteristics of the p-type contact layer 7 tend to increase. Moreover, in the ultraviolet light emitting element 10, when the thickness of the p-type contact layer 7 is greater than 500 nm, the possibility of occurrence of cracks due to accumulation of strains tends to increase.

The p-type contact layer 7 preferably contains Mg as an acceptor impurity, a doping concentration of the Mg in the p-type contact layer 7 being preferably greater than or equal to $1 \times 10^{20}$ cm$^{-3}$ and less than or equal to $5 \times 10^{20}$ cm$^{-3}$. When the doping concentration of Mg in the p-type contact layer 7 is less than $1 \times 10^{20}$ cm$^{-3}$, the light emission efficiency of the ultraviolet light emitting element 10 tends to decrease. This is probably because the hole injection performance of the p-type contact layer 7 is impaired. Moreover, in the ultraviolet light emitting element 10, when the doping concentration of Mg in the p-type contact layer 7 is less than $1 \times 10^{20}$ cm$^{-3}$, an ohmic contact may not be established or contact resistance tends to increase between the second electrode 9 and the p-type contact layer 7. Moreover, in the ultraviolet light emitting element 10, when the doping concentration of Mg in the p-type contact layer 7 is greater than $5 \times 10^{20}$ cm$^{-3}$, the crystallinity of the p-type contact layer 7 tends to be degraded.

The ultraviolet light emitting element 10 preferably includes a first pad electrode on the first electrode 8. The first pad electrode can include a layered film including, for example, a Ti film on the first electrode 8 and an Au film on the Ti film. The first pad electrode is electrically connected to the first electrode 8. The first pad electrode preferably covers the first electrode 8.

Moreover, the ultraviolet light emitting element 10 preferably includes a second pad electrode on the second electrode 9. The second pad electrode can include a layered film including, for example, a Ti film on the second electrode 9 and an Au film on the Ti film. The second pad electrode is electrically connected to the second electrode 9. The second pad electrode preferably covers the second electrode 9.

The ultraviolet light emitting element 10 can be mounted on, for example, a mounting substrate. The term "mount" represents a concept including disposing and mechanically connecting the ultraviolet light emitting element 10 and electrically connecting the ultraviolet light emitting element 10. The mounting substrate includes a plate-like support member and a wiring section which is supported by the support member and to which the ultraviolet light emitting element 10 is to be electrically connected. The wiring section may be a configuration including, for example, a first conductor section to which the first pad electrode is to be electrically connected and a second conductor section to which the second pad electrode is to be electrically connected. The ultraviolet light emitting device can be mounted on the mounting substrate, for example, by bonding the first pad electrode and the first conductor section of the ultraviolet light emitting element 10 via a first bump and by bonding the second pad electrode and the second conductor section of the ultraviolet light emitting element 10 via a second bump. The first bump and the second bump can be, for example, gold bumps. The ultraviolet light emitting device may have a configuration including one ultraviolet light emitting element 10 mounted on one mounting substrate or a configuration including a plurality of ultraviolet light emitting elements 10 mounted on one mounting substrate.

The support member has a function of supporting the wiring section. The support member preferably has a function of serving as a heat sink for effectively transferring heat generated in the ultraviolet light emitting element 10 to the outside.

The ultraviolet light emitting device preferably includes a lid member made of glass and disposed to cover the ultraviolet light emitting element 10 in addition to the mounting substrate and the ultraviolet light emitting element 10. The lid member transmits ultraviolet light emitted from the ultraviolet light emitting element 10. The lid member may have a flat plate shape, a lens shape, or a partly lens shape. Alternatively, the lid member may have a dome shape. The ultraviolet light emitting device may include a frame member disposed between the mounting substrate and the lid member to surround the ultraviolet light emitting element 10. The frame member may also serve as a reflector for reflecting light laterally emitted from the ultraviolet light emitting element 10 toward the lid member.

In the ultraviolet light emitting device, the mounting substrate may be an interposer, and the interposer may be bonded to, for example, a metal-based printed-wiring board.

A method for fabricating the ultraviolet light emitting element 10 will be briefly described below.

In the method for fabricating the ultraviolet light emitting element 10, a sapphire wafer is first prepared which will be a sapphire substrate 1 of each of a plurality of ultraviolet light emitting elements 10.

In the method for fabricating the ultraviolet light emitting element 10, after the sapphire wafer has been prepared, the sapphire wafer is subjected to pretreatment. Then, the sapphire wafer is introduced into an epitaxial growth apparatus. Thereafter, a multilayer structure 20 is stacked on a first surface of the sapphire wafer by an epitaxial growth method. The first surface of the sapphire wafer is a surface corresponding to a first surface 1a of the sapphire substrate 1. When a low-pressure MOVPE apparatus is used as the epitaxial growth apparatus, trimethylaluminum (TMAl) is preferably used as a source gas of Al. Moreover, as a source gas of Ga, trimethylgallium (TMGa) is preferably used. As a source gas of N, $NH_3$ is preferably used. As a source gas of Si which is an impurity imparting n-type conductivity, tetraethylsilane (TESi) is preferably used. As a source gas of Mg which is an impurity contributing to the p-type conductivity, bis(cyclopentadienyl)magnesium ($Cp_2Mg$) is preferably used. As a carrier gas of each source gas, for example, a $H_2$ gas is preferably used. The source gases are not particularly limited, and for example, triethylgallium (TEGa) may be used as a source gas of Ga, a hydrazine derivative may be used as a source gas of N, and monosilane ($SiH_4$) may be used as a source gas of Si. As the growth condition of the multilayer structure 20, the substrate temperature, the V/III ratio, the supply volume of each source gas, the growing pressure, and the like are accordingly set for each of a buffer layer 2, an n-type AlGaN layer 3, barrier layers 41, well layers 42, a cap layer 5, a first p-type AlGaN layer 61, a second p-type AlGaN layer 62, and a p-type contact layer 7. The substrate temperature means the temperature of the sapphire wafer. When an MOVPE apparatus is used as the epitaxial growth apparatus, the substrate temperature can be replaced with, for example, the temperature of a susceptor supporting the sapphire wafer.

In the method for fabricating the ultraviolet light emitting element 10, after the multilayer structure 20 has been stacked on the first surface of the sapphire wafer, the sapphire wafer provided with the stacked multilayer structure 20 is taken out from the epitaxial growth apparatus. A structure including at least the sapphire wafer and the multilayer structure 20 is hereinafter referred to as a wafer.

In the method for fabricating the ultraviolet light emitting element 10, the wafer taken out from the epitaxial growth apparatus is introduced into an annealing apparatus to perform annealing to activate p-type impurities in the first p-type AlGaN layer 61, the second p-type AlGaN layer 62, and the p-type contact layer 7. As the annealing apparatus for annealing, for example, a lamp annealing apparatus, a furnace annealing apparatus, or the like can be used. The p-type impurity means an acceptor impurity and is Mg.

In the method for fabricating the ultraviolet light emitting element 10, after the wafer has been taken out from the annealing apparatus, a mesa structure 11 is formed by a photolithography technique, an etching technique, and the like.

In the method for fabricating the ultraviolet light emitting element 10, after the mesa structure 11 has been formed, an insulative film is formed. The insulative film can be formed by using a thin film formation technique such as a chemical vapor deposition (CVD) method, a photolithography technique, and an etching technique.

In the method for fabricating the ultraviolet light emitting element 10, after the insulative film has been formed, a first electrode 8 is formed. To form the first electrode 8, a first resist layer patterned to expose only an area in which the first electrode 8 will be formed is first formed on a surface of the wafer. Thereafter, for example, a first Al layer having a thickness of 100 nm, a first Ni layer having a thickness of 20 nm, a second Al layer having a thickness of 100 nm, a second Ni layer having a thickness of 20 nm, and an Au layer having a thickness of 100 nm are stacked by an evaporation method, thereby forming a first layered film. After the first layered film has been formed, lift-off is preformed to remove the first resist layer and unwanted film on the first resist layer (part of the first layered film formed on the first resist layer), thereby patterning the first layered film. Thereafter, an annealing process is performed. The annealing process is a process to make a contact between the first electrode 8 and the n-type AlGaN layer 3 into an ohmic contact. The layered structure of the first layered film and the thickness of each layer of the first layered film are mere examples and are not particularly limited. The annealing process is preferably Rapid Thermal Annealing (RTA) in a $N_2$ gas atmosphere.

Conditions for the RTA process are, for example, an annealing temperature of 700° C. and annealing time of 1 minute, but these values are mere examples and are not particularly limited. The annealing temperature is preferably a temperature at which Al diffusion is easily caused, and is more preferably a temperature higher than or equal to 650° C. and lower than 750° C. The annealing time may be set within the range of, for example, about 30 seconds to about 3 minutes.

In the method for fabricating the ultraviolet light emitting element 10, after the first electrode 8 has been formed, a second electrode 9 is formed. To form the second electrode 9, a second resist layer patterned to expose only an area in which the second electrode 9 will be formed is first formed on the surface of the wafer. Thereafter, a second layered film including, for example, a Ni layer having a thickness of 20 nm and an Au layer having a thickness of 150 nm is formed by an electron beam evaporation method, and lift-off is performed to remove the second resist layer and an unwanted film on the second resist layer (part of the second layered film formed on the second resist layer). Then, the RTA process is performed in an $N_2$ gas atmosphere to make a contact between the second electrode 9 and the p-type contact layer 7 into an ohmic contact. The layered structure of the second layered film and the thickness of each layer of the second layered film are mere examples and are not particularly limited. Moreover, conditions for the RTA process are, for example, an annealing temperature of 500° C. and annealing time of 15 minutes, but these values are mere examples, and the conditions for the RTA process are not particularly limited.

A first pad electrode and a second pad electrode are formed by a lift-off method by using, for example, a photolithography technique and a thin film formation technique.

The method for fabricating the ultraviolet light emitting element 10 can provide a wafer on which a plurality of ultraviolet light emitting elements 10 has been formed.

In the method for fabricating the ultraviolet light emitting element 10, the wafer is cut by using, for example, a dicing saw, thereby obtaining the plurality of ultraviolet light emitting elements 10 from the one wafer. In the method for fabricating the ultraviolet light emitting element 10, a second surface of the sapphire wafer is preferably polished before the wafer is cut, so that the thickness of the sapphire wafer is equal to the desired thickness of the sapphire substrate 1. In this way, the method for fabricating the ultraviolet light emitting element 10 can increase fabrication yield.

The inventors of the present application focused on the thickness of the cap layer 5 and fabricated ultraviolet light emitting elements 10 having various thicknesses of the cap layers 5 to measure the light emission efficiencies of the ultraviolet light emitting elements 10. FIG. 2 is a graph illustrating the relationship between the thickness of the cap layer 5 and the relative light emission efficiency. The relative light emission efficiency means a relative light emission efficiency of the case where the light emission efficiency of a comparative example is 1, where the thickness of the cap layer 5 is 0, i.e., the cap layer 5 is not provided in the comparative example. The light emission efficiency of the ultraviolet light emitting element 10 is a value computed from an emission peak wavelength and a value obtained by measuring ultraviolet light emitted from the ultraviolet light emitting element 10 by using an integrating sphere when a direct current of 20 mA flows through the ultraviolet light emitting element 10. The light emission efficiency of the ultraviolet light emitting element of the comparative example is a value obtained in a similar manner.

Figure 2:
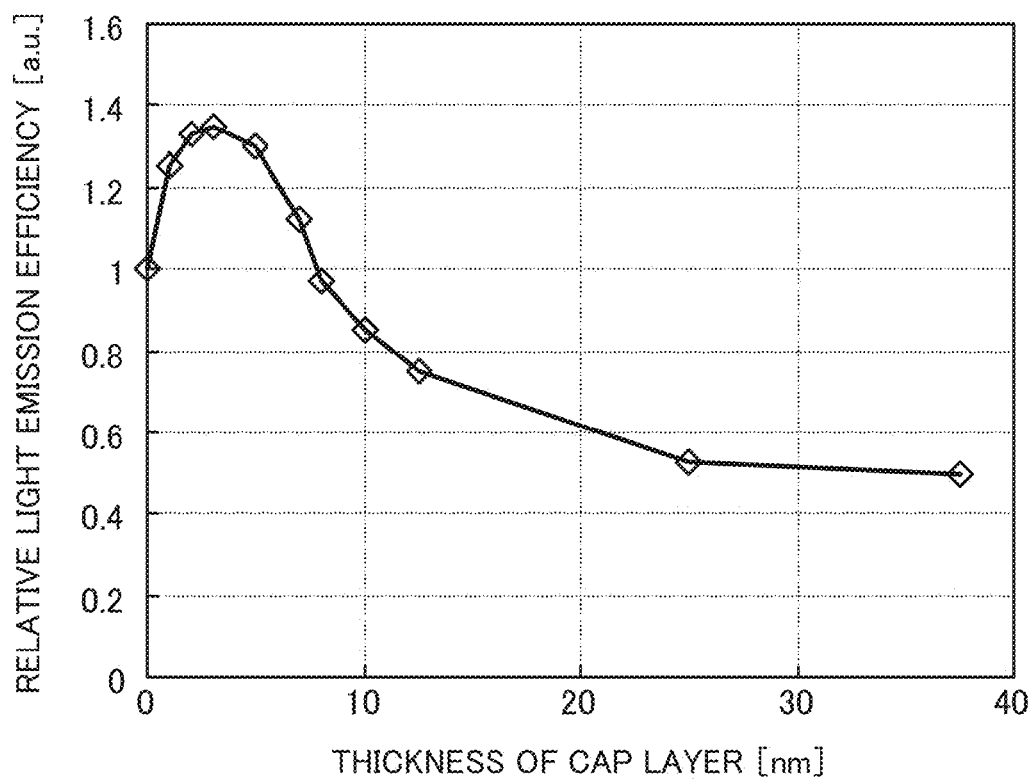
FIG. 2 is a graph illustrating the relationship between the thickness of a cap layer and the relative light emission efficiency.

From FIG. 2, the inventors of the present application found that when the thickness of the cap layer 5 is set within the range of 1 nm to 7 nm, the light emission efficiency can be increased as compared to the comparative example.

In the ultraviolet light emitting element 10 of the present embodiment, the cap layer 5 has a thickness of greater than or equal to 1 nm and less than or equal to 7 nm, and therefore the light emission efficiency can be increased. The inventors of the present application confirmed, based on the measurement result of the depth profile of Mg concentration by the SIMS, that the diffusion of the Mg from the electron barrier layer 6 to the light emitting layer 4 in the ultraviolet light emitting element 10 is reduced. When the thickness of the cap layer 5 is greater than or equal to 1 nm and less than or equal to 7 nm, the light emission efficiency of the ultraviolet light emitting element 10 can be increased probably because the diffusion of Mg from the electron barrier layer 6 to the light emitting layer 4 is reduced and it becomes possible to suppress inhibition of injection of holes from the electron barrier layer 6 to the light emitting layer 4.

The third AlGaN layer included in the cap layer 5 is preferably an undoped AlGaN layer. The term "undoped" means that a specific impurity is not purposely added. That is, the cap layer 5 may contain an impurity such as Mg, H, Si, C, or O which is inevitably incorporated during the growth of the cap layer 5. As a result of, for example, the SIMS analysis of the concentration of each impurity in the undoped AlGaN layer, the concentration of Mg was $1 \times 10^{17}$ $cm^{-3}$, the concentration of H was $1 \times 10^{18}$ $cm^{-3}$, the concentration of Si was $2 \times 10^{17}$ $cm^{-3}$, the concentration of C was $7 \times 10^{16}$ $cm^{-3}$, and the concentration of O was $7 \times 10^{16}$ $cm^{-3}$, but the concentrations are not limited to these values. In the undoped AlGaN layer, the concentration of Mg is preferably less than or equal to $5 \times 10^{17}$ $cm^{-3}$, the concentration of H is preferably less than or equal to $2 \times 10^{18}$ $cm^{-3}$, the concentration of Si is preferably less than or equal to $5 \times 10^{17}$ $cm^{-3}$, the concentration of C is preferably less than or equal to $3 \times 10^{17}$ $cm^{-3}$, and the concentration of O is preferably less than or equal to $3 \times 10^{17}$ $cm^{-3}$.

When the undoped AlGaN layer is used as the third AlGaN layer, the lifetime of the ultraviolet light emitting element 10 can be extended as compared to a case where a Si-doped AlGaN layer doped with Si at a concentration than higher than $5 \times 10^{17}$ $cm^{-3}$ is used as the third AlGaN layer. This was confirmed by conducting an energization test of making a direct current of 50 mA flow through the ultraviolet light emitting element 10 and by measuring changes in emission intensity over time. The lifetime of the ultraviolet light emitting element 10 can be reduced probably because when the third AlGaN layer is a Si-doped AlGaN layer, Si of the cap layer 5 and Mg diffused from the electron barrier layer 6 to the cap layer 5 easily contribute to the donor-acceptor pair emission in the cap layer 5.

Figure 4:
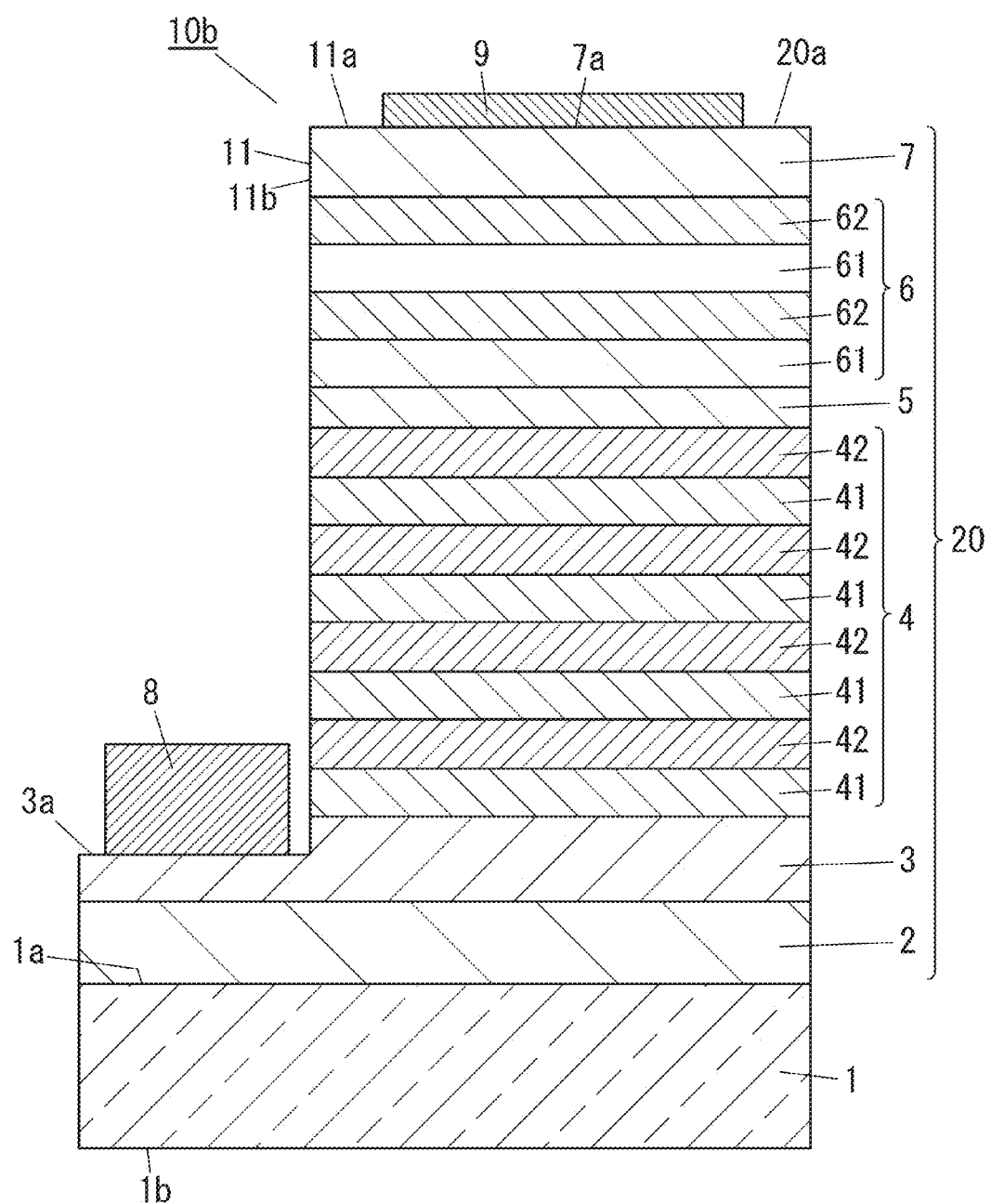
FIG. 4 is a sectional view schematically illustrating an ultraviolet light emitting element of a variation of the embodiment.

FIG. 4 shows a sectional view schematically illustrating an ultraviolet light emitting element 10b of a variation of the ultraviolet light emitting element 10. The configurations of a light emitting layer 4 and an electron barrier layer 6 of the ultraviolet light emitting element 10b are different from those of the ultraviolet light emitting element 10. The same components of the ultraviolet light emitting element 10b as those in the ultraviolet light emitting element 10 are indicated by the same reference symbols, and the description thereof will be omitted accordingly.

The light emitting layer 4 of the ultraviolet light emitting element 10b includes four barrier layers 41 and four well layers 42.

The electron barrier layer 6 of the ultraviolet light emitting element 10b includes first p-type AlGaN layers 61 and a second p-type AlGaN layer 62 alternately arranged in the thickness direction of the light emitting layer 4. With this configuration, the light emission efficiency of the ultraviolet light emitting element 10b can be increased. This is probably because the electron blocking function of the electron barrier layer 6 can be improved, and thus the efficiency of electron injection to the light emitting layer 4 can be improved. The phrase "a first p-type AlGaN layer 61 and a second p-type AlGaN layer 62 alternately arranged in the thickness direction of the light emitting layer 4" means that at least one p-type AlGaN layer 61 and at least one second p-type AlGaN layer 62 are provided. This phrase represents a concept also including a configuration in which only three layers, for example, one first p-type AlGaN layer 61, one second p-type AlGaN layer 62, and one first p-type AlGaN layer 61 are arranged.

The electron barrier layer 6 preferably includes at least two first p-type AlGaN layers 61 and at least two second p-type AlGaN layers 62. The light emission efficiency of the ultraviolet light emitting element 10b can be further increased by configuring the electron barrier layer 6 as a multiple electron barrier layer including the first p-type AlGaN layers 61 and the second p-type AlGaN layers 62 alternately arranged in the thickness direction of the light emitting layer 4. In the ultraviolet light emitting element 10b, each of the number of first p-type AlGaN layers 61 and the number of second p-type AlGaN layers of the electron barrier layer 6 is two, but the number of first p-type AlGaN layers 61 and the number of second p-type AlGaN layers are not particularly limited. In the ultraviolet light emitting element 10b, the number of the first p-type AlGaN layers 61 and the number of the second p-type AlGaN layers are equal to each other but may be different from each other.

The electron barrier layer 6 preferably includes two first p-type AlGaN layers 61 and two second p-type AlGaN layers 62, and the total thickness of the two first p-type AlGaN layers 61 is preferably greater than or equal to 7 nm and less than or equal to 24 nm. With this configuration, the light emission efficiency of the ultraviolet light emitting element 10b can be increased. In Table 1 below, the light emission efficiencies in various combinations of the thicknesses of the first p-type AlGaN layers 61 and the second p-type AlGaN layers 62 of the electron barrier layer 6 are shown. In Table 1, the first p-type AlGaN layer 61 closest to the cap layer 5 is referred to as a "first layer," the second p-type AlGaN layer 62 second closest to the cap layer 5 is referred to as a "second layer," the first p-type AlGaN layer 61 third closest to the cap layer 5 is referred to as a "third layer," and the second p-type AlGaN layer 62 fourth closest to the cap layer 5 is referred to as a "fourth layer," and the thicknesses of the first to fourth layers are shown. In Table 1, a value obtained by dividing the average thickness of the two first p-type AlGaN layers 61 of the layered structure including one of the first p-type AlGaN layers 61, the second p-type AlGaN layer 62, and a remaining layer of the first p-type AlGaN layers 61 by the thickness of the second p-type AlGaN layer 62 is shown as "thickness ratio." In Table 1, a relative light emission efficiency obtained with reference to the light emission efficiency of the case where the thickness of the second layer is 0 is shown as "relative light emission efficiency." In Table 1, the relative lifetime obtained with reference to the lifetime of the case where the thickness of the second layer is 0 is shown as "relative lifetime." Here, "lifetime" is a time period from a time point at which the value of the light output is an initial value to a time point at which the value of the light output has decreased to a value of 70% of the initial value in a high-temperature energization test (accelerated test) performed at a temperature of 120° C. and at an energizing current of 20 mA. The light output is a value measured by using an integrating sphere and a spectrometer.

TABLE 1

| Thickness of 1st Layer (nm) | Thickness of 2nd Layer (nm) | Thickness of 3rd Layer (nm) | Thickness of 4th Layer (nm) | Average Thickness of 1st Layer and 3rd Layer (nm) | Total Thickness of 1st Layer and 3rd Layer (nm) | Thickness Ratio | Light Emission Efficiency (%) | Relative Light Emission Efficiency | Relative Lifetime |
|---|---|---|---|---|---|---|---|---|---|
| 7.0 | 4.9 | 6.9 | 10.0 | 6.95 | 13.90 | 1.42 | 1.9 | 0.95 | 1.05 |
| 7.1 | 4.0 | 6.9 | 9.8 | 7.00 | 14.00 | 1.75 | 2.0 | 1.0 | 1.03 |
| 6.9 | 2.0 | 6.8 | 10.0 | 6.85 | 13.70 | 3.43 | 2.3 | 1.15 | 1.02 |
| 7.0 | 0.9 | 7.0 | 9.9 | 7.00 | 14.00 | 7.78 | 2.4 | 1.2 | 1.0 |
| 7.1 | 0.5 | 6.9 | 9.9 | 7.00 | 14.00 | 14.00 | 2.0 | 1.0 | 1.0 |
| 7.0 | 0 | 7.0 | 10.0 | 7.00 | 14.00 | ∞ | 2.0 | 1.0 | 1.0 |
| 2.0 | 1.0 | 1.9 | 10.0 | 1.95 | 3.90 | 1.95 | 1.7 | 0.85 | 0.5 |
| 3.5 | 1.0 | 3.5 | 9.8 | 3.50 | 7.00 | 3.50 | 2.0 | 1.0 | 0.6 |
| 6.0 | 1.0 | 5.9 | 9.9 | 5.95 | 11.90 | 5.95 | 2.1 | 1.0 | 0.95 |
| 8.0 | 1.0 | 7.9 | 10.1 | 7.95 | 15.90 | 7.95 | 2.1 | 1.05 | 1.03 |
| 11.1 | 1.0 | 11.0 | 10.0 | 11.05 | 22.10 | 11.05 | 2.05 | 1.025 | 1.05 |
| 12.0 | 1.0 | 12.0 | 10.0 | 12.00 | 24.00 | 12.00 | 2.0 | 1.0 | 1.05 |
| 14.0 | 1.0 | 14.0 | 10.1 | 14.00 | 28.00 | 14.00 | 1.5 | 0.75 | 1.1 |

The electron barrier layer 6 preferably has a layered structure including a first p-type AlGaN layer 61, a second p-type AlGaN layer 62, and a first p-type AlGaN layer 61, and a value ("thickness ratio" in Table 1) obtained by dividing the average thickness of the two first p-type AlGaN layers 61 by the thickness of the second p-type AlGaN layer 62 is preferably greater than 1.75 and less than 14. With this configuration, the light emission efficiency of the ultraviolet light emitting element 10b can be increased. The light emission efficiency can be increased probably because the overflow of electrons having energy higher than or equal to the barrier height of each barrier layer 41 is suppressed due to a quantum-mechanical effect. The effect of suppressing the overflow of electrons may be reduced when the thickness ratio is less than or equal to 1.75 probably because the quantum-mechanical effect is scarcely produced. The hole injection performance may also be reduced when the thickness ratio is greater than 14 probably because the quantum-mechanical effect is scarcely produced.

Figure 5:
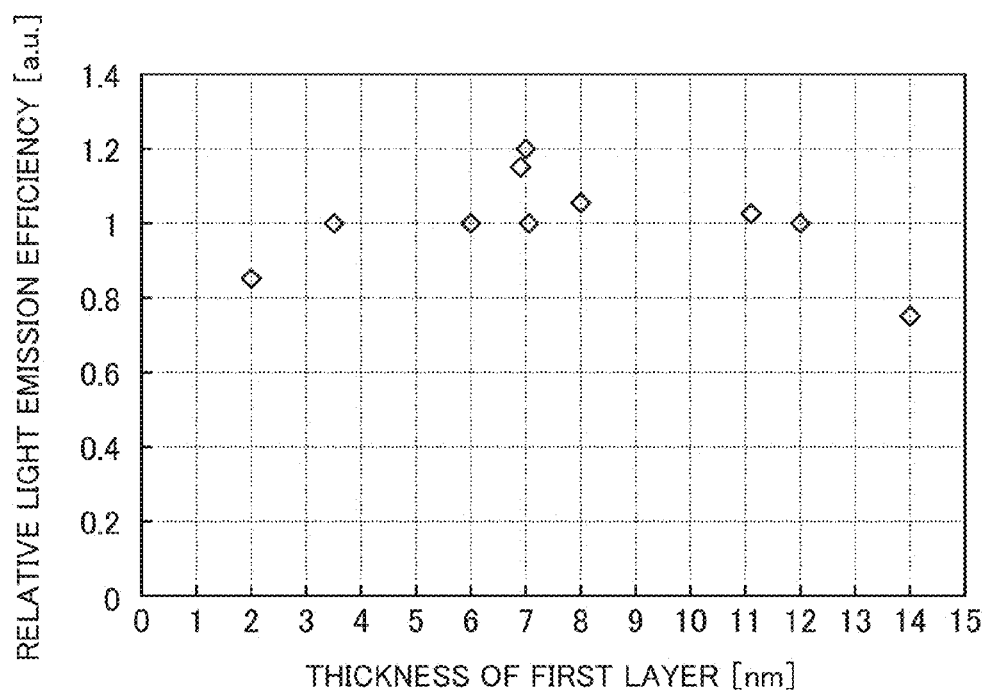
FIG. 5 is a graph illustrating the relationship between the thickness of a first layer (first p-type AlGaN layer closest to the cap layer) and the relative light emission efficiency.
Figure 6:
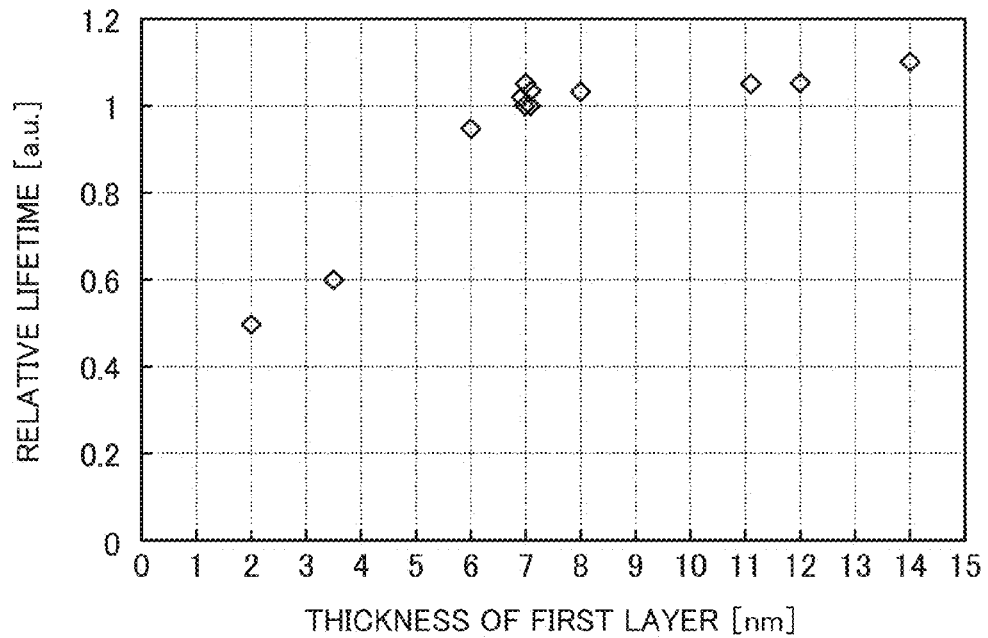
FIG. 6 is a graph illustrating the relationship between the thickness of the first layer and the relative lifetime.

FIG. 5 is a graph in which the relationship between the thickness of the first layer (the first p-type AlGaN layer 61 closest to the cap layer 5) and the relative light emission efficiency is summarized based on the results in Table 1. FIG. 6 is a graph in which the relationship between the thickness of the first layer and the relative lifetime is summarized based on the results in Table 1.

The electron barrier layer 6 preferably has a layered structure including a first p-type AlGaN layer 61, a second p-type AlGaN layer 62, and a first p-type AlGaN layer 61, and one of the first p-type AlGaN layers 61 closest to the cap layer 5 preferably has a thickness greater than a thickness of the other of the first p-type AlGaN layers 61, and the thickness of the one first p-type AlGaN layer 61 is preferably greater than or equal to 7 nm and less than or equal to 12 nm. With this configuration, the light emission efficiency and the reliability of the ultraviolet light emitting element 10b can be increased.

In FIG. 6, the relative lifetime is relatively widely decreases when the thickness of the first layer is less than 6 nm probably because defects are likely to be formed in the first p-type AlGaN layer 61 closest to the cap layer 5 due to damage caused by electrons overflowed from the light emitting layer 4. Therefore, in the ultraviolet light emitting element 10b, in terms of increasing reliability, the thickness of the first p-type AlGaN layer 61 closest to the cap layer 5 is preferably greater than or equal to 6 nm and more preferably greater than or equal to 7 nm.

Note that the light emission efficiency and the reliability of the ultraviolet light emitting element 10b may be increased also when the thickness of the first p-type AlGaN layer 61 closest to the cap layer 5 is 6 nm. Moreover, the light emission efficiency and the reliability of the ultraviolet light emitting element 10b may be increased also when the thickness of the first p-type AlGaN layer 61 closest to the cap layer 5 is 13 nm.

The ultraviolet light emitting elements 10 and 10b are not limited to ultraviolet light-emitting diodes but may be ultraviolet laser diodes.

The ultraviolet light emitting elements 10 and 10b each can be used as a component included in, for example, an electrical device. Since the electrical device includes the ultraviolet light emitting element 10 or 10b and a device body, the light emission efficiency of the electrical device can be increased.

Figure 7:
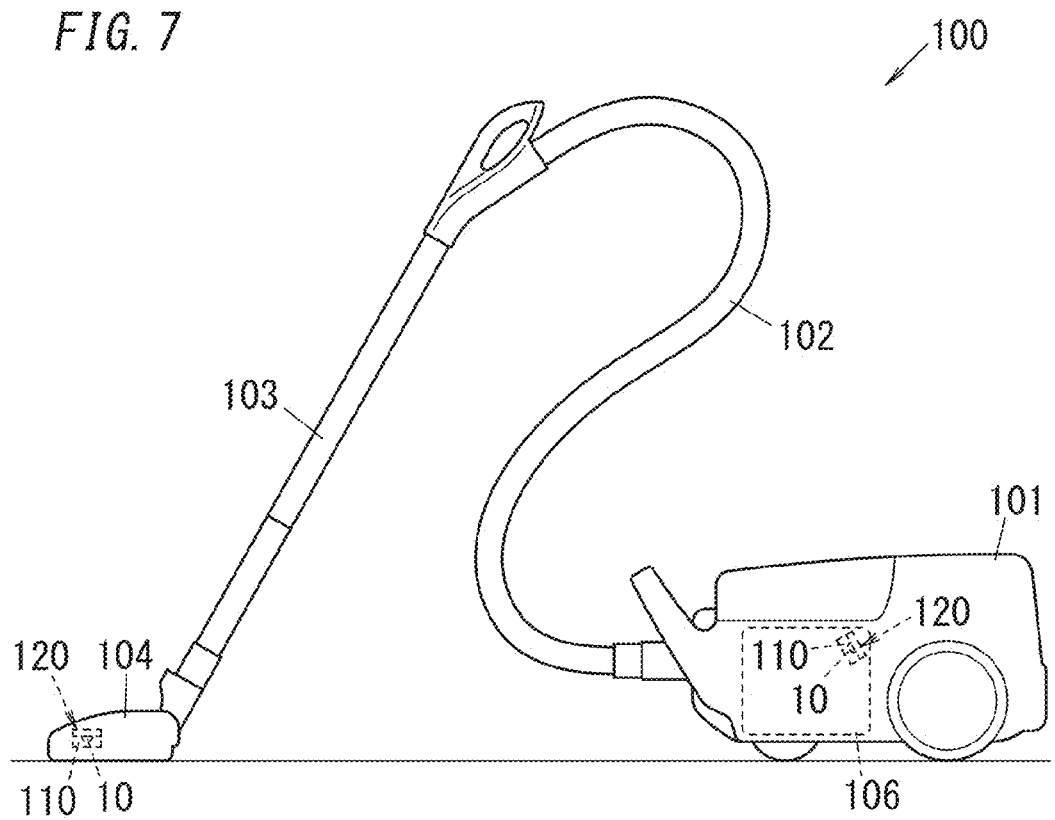
FIG. 7 is a view schematically illustrating the configuration of an electric vacuum cleaner as an example of an electrical device of the embodiment.

An example of the electrical device includes an electric vacuum cleaner 100 as illustrated in FIG. 7. The electric vacuum cleaner 100 includes a vacuum cleaner body (device body) 101, a hose 102 configured to be connected to a suction port of the vacuum cleaner body 101, a connection pipe 103 provided to a tip of the hose 102, and a suction tool 104 provided to a tip of the connection pipe 103. The suction tool 104 has an opening to suck up dust. The suction tool 104 may include a brush. The vacuum cleaner body 101 accommodates an electric blower configured to suck air containing dust and a dust collection container 106 in which the dust is to be collected. The electric vacuum cleaner 100 includes two ultraviolet light emitting devices 120 each including a plurality of ultraviolet light emitting elements 10 accommodated in one package 110. One of the ultraviolet light emitting devices 120 is accommodated in the suction tool 104 and the other of the ultraviolet light emitting devices 120 are accommodated in the vacuum cleaner body 101. The ultraviolet light emitting device 120 accommodated in the suction tool 104 is arranged to emit ultraviolet light to the opening of the suction tool 104. With this configuration, the electric vacuum cleaner 100 can perform cleaning while performing sterilization. The ultraviolet light emitting device 120 accommodated in the vacuum cleaner body 101 is arranged to emit ultraviolet light into the dust collection container 106. With this configuration, the electric vacuum cleaner 100 can perform sterilization of the dust collection container 106 and sterilization of air passing through the dust collection container 106. The electric vacuum cleaner 100 may include only one of the two ultraviolet light emitting devices 120. The number of ultraviolet light emitting devices 120 is not limited to two.

Figure 8:
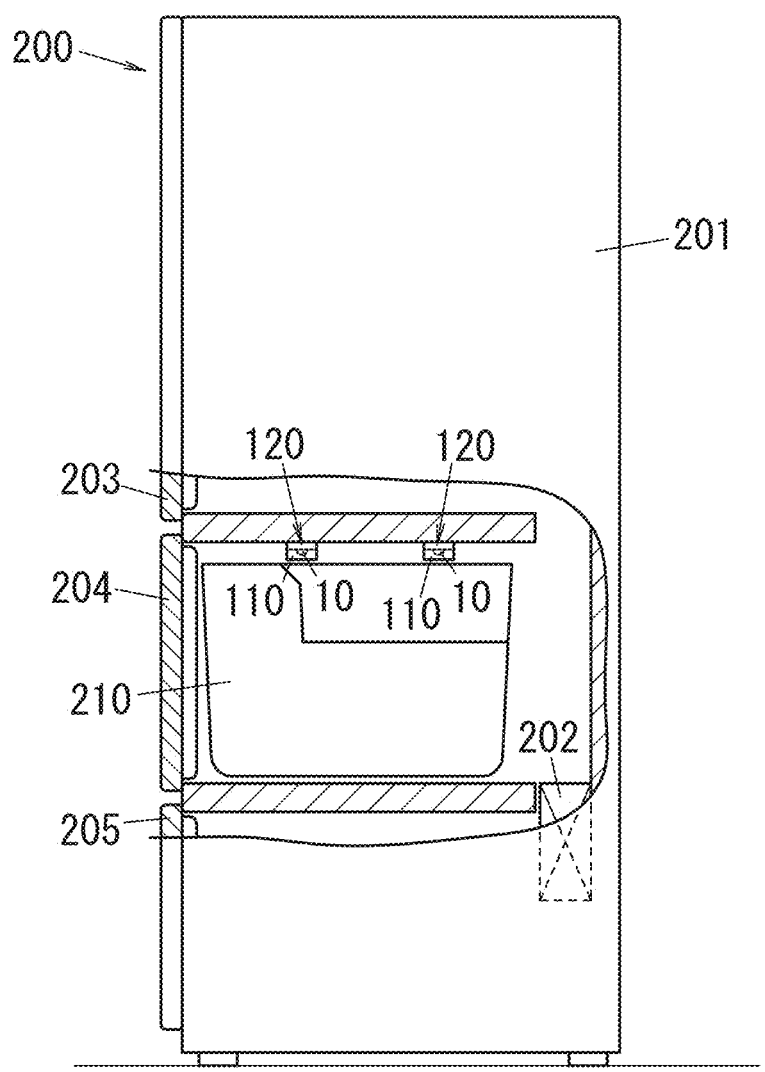
FIG. 8 is a view schematically illustrating the configuration of a refrigerator as another example of the electrical device of the embodiment.

Another example of the electrical device can be, for example, a refrigerator 200 as illustrated in FIG. 8. The refrigerator 200 includes a refrigerator body 201, a cooler 202, three doors 203, 204, and 205 to open/close three openings of the refrigerator body 201, and a vegetable container 210 accommodated in the refrigerator body 201. The refrigerator 200 includes a plurality of ultraviolet light emitting devices 120 accommodating a plurality of ultraviolet light emitting elements 10 in one package 110. The plurality of ultraviolet light emitting devices 120 are arranged to emit ultraviolet light into the vegetable container 210. With this configuration, the refrigerator 200 can suppress proliferation of fungi and/or bacteria on vegetables. The refrigerator 200 can suppress proliferation of fungi and/or bacteria on foods as long as the ultraviolet light emitting device 120 is arranged to emit ultraviolet light to appropriate space in the refrigerator body 201.

The drawings, with reference to which the above-mentioned embodiments and the like have been described, are schematic representations, and the ratio of the sizes and/or the thicknesses of the components are not necessarily to scale. The materials, numerical values, and the like mentioned in the embodiments, and the like are mere preferable examples and do not intend to limit the invention. Moreover, the configurations of the present invention may be modified accordingly without departing from the technical scope of the present invention.

The invention claimed is:

1. An ultraviolet light emitting element, comprising:
   a sapphire substrate;
   an n-type AlGaN layer;
   a light emitting layer;
   a cap layer;
   an electron barrier layer; and
   a p-type contact layer including a p-type GaN layer,
   wherein
   the light emitting layer has a multi-quantum well structure,
   the multi-quantum well structure includes
      a plurality of barrier layers each being a first AlGaN layer and
      a plurality of well layers each being a second AlGaN layer,
   the electron barrier layer includes
      at least one first p-type AlGaN layer having an Al composition ratio higher than an Al composition ratio of each of the barrier layers and
      at least one second p-type AlGaN layer having an Al composition ratio higher than an Al composition ratio of each of the plurality of well layers and lower than the Al composition ratio of the at least one first p-type AlGaN layer,
   the at least one first p-type AlGaN layer and the at least one second p-type AlGaN layer contain Mg,
   the cap layer is located between one well layer of the plurality of well layers of the multi-quantum well structure and the at least one first p-type AlGaN layer, the one well layer being closest to the at least one first p-type AlGaN layer, the cap layer is a third AlGaN layer having an Al composition ratio higher than the Al composition ratio of each of the plurality of well layers and lower than the Al composition ratio of the at least one first p-type AlGaN layer, and the cap layer has a thickness of greater than or equal to 1 nm and less than or equal to 7 nm; and the third AlGaN layer is an undoped AlGaN layer.

2. An ultraviolet light emitting element, comprising:
a sapphire substrate;
an n-type AlGaN layer;
a light emitting layer;
a cap layer;
an electron barrier layer; and
a p-type contact layer including a p-type GaN layer, wherein the light emitting layer has a multi-quantum well structure, the multi-quantum well structure includes
a plurality of barrier layers each being a first AlGaN layer and
a plurality of well layers each being a second AlGaN layer, the electron barrier layer includes
at least one first p-type AlGaN layer having an Al composition ratio higher than an Al composition ratio of each of the barrier layers and
at least one second p-type AlGaN layer having an Al composition ratio higher than an Al composition ratio of each of the plurality of well layers and lower than the Al composition ratio of the at least one first p-type AlGaN layer, the at least one first p-type AlGaN layer and the at least one second p-type AlGaN layer contain Mg, the cap layer is located between one well layer of the plurality of well layers of the multi-quantum well structure and the at least one first p-type AlGaN layer, the one well layer being closest to the at least one first p-type AlGaN layer, the cap layer is a third AlGaN layer having an Al composition ratio higher than the Al composition ratio of each of the plurality of well layers and lower than the Al composition ratio of the at least one first p-type AlGaN layer, and the cap layer has a thickness of greater than or equal to 1 nm and less than or equal to 7 nm; and the at least one first p-type AlGaN layer including a plurality of first p-type AlGaN layers and the at least one second p-type AlGaN layer of the electron barrier layer are alternately arranged in a thickness direction of the light emitting layer.

3. The ultraviolet light emitting element according to claim 2, wherein the electron barrier layer includes
the at least one first p-type AlGaN layer including at least two first p-type AlGaN layers and
the at least one second p-type AlGaN layer including at least two second p-type AlGaN layers.

4. The ultraviolet light emitting element according to claim 3, wherein the electron barrier layer includes
the at least one first p-type AlGaN layer including two first p-type AlGaN layers and
the at least one second p-type AlGaN layer including two second p-type AlGaN layers, and a total thickness of the two first p-type AlGaN layers is greater than or equal to 7 nm and less than or equal to 24 nm.

5. The ultraviolet light emitting element according to claim 2, wherein
the electron barrier layer has a layered structure including one of the first p-type AlGaN layers, one second p-type AlGaN layer of the at least one second p-type AlGaN layer, and a remaining layer of the first p-type AlGaN layers, and a value obtained by dividing an average thickness of the one and the remaining layer of the first p-type AlGaN layers by a thickness of the one second p-type AlGaN layer is greater than 1.75 and less than 14.

6. The ultraviolet light emitting element according to claim 2, wherein
the electron barrier layer has a layered structure including one of the first p-type AlGaN layers, one of the at least one second p-type AlGaN layer, and a remaining layer of the first p-type AlGaN layers, one layer of the first p-type AlGaN layers closest to the cap layer has a thickness greater than a thickness of a remaining layer of the first p-type AlGaN layers, and the thickness of the one layer is greater than or equal to 7 nm and less than or equal to 12 nm.

7. An ultraviolet light emitting element, comprising:
a sapphire substrate;
an n-type AlGaN layer;
a light emitting layer;
a cap layer;
an electron barrier layer; and
a p-type contact layer including a p-type GaN layer, wherein the light emitting layer has a multi-quantum well structure, the multi-quantum well structure includes
a plurality of barrier layers each being a first AlGaN layer and
a plurality of well layers each being a second AlGaN layer, the electron barrier layer includes
at least one first p-type AlGaN layer having an Al composition ratio higher than an Al composition ratio of each of the barrier layers and
at least one second p-type AlGaN layer having an Al composition ratio higher than an Al composition ratio of each of the plurality of well layers and lower than the Al composition ratio of the at least one first p-type AlGaN layer, the at least one first p-type AlGaN layer and the at least one second p-type AlGaN layer contain Mg, the cap layer is located between one well layer of the plurality of well layers of the multi-quantum well structure and the at least one first p-type AlGaN layer, the one well layer being closest to the at least one first p-type AlGaN layer, the cap layer is a third AlGaN layer having an Al composition ratio higher than the Al composition ratio of each of the plurality of well layers and lower than the Al composition ratio of the at least one first p-type AlGaN layer, and the cap layer has a thickness of greater than or equal to 1 nm and less than or equal to 7 nm;

in a multilayer structure including the n-type AlGaN layer, the light emitting layer, the cap layer, the electron barrier layer, and the p-type contact layer, the n-type AlGaN layer, the light emitting layer, the cap layer, the electron barrier layer, and the p-type contact layer are arranged in this order from a side close to the sapphire substrate, and the ultraviolet light emitting element includes a buffer layer between the sapphire substrate and the n-type AlGaN layer, the buffer layer including an $Al_xGa_{1-x}N$ layer, where $0 < x \le 1$, and a full width at half maximum of an X-ray rocking curve obtained by ω scan X-ray diffraction on a (10-12) plane of the $Al_xGa_{1-x}N$ layer is less than or equal to 400 arcsec, where $0 < x \le 1$.

8. The ultraviolet light emitting element according to claim 7, wherein
the buffer layer has band gap energy greater than band gap energy of each of the plurality of well layers.

9. The ultraviolet light emitting element according to claim 7, wherein
the buffer layer is an AlN layer.

10. The ultraviolet light emitting element according to claim 7, wherein
the buffer layer has a thickness of greater than or equal to 3 μm and less than or equal to 6 μm.

11. The ultraviolet light emitting element according to claim 10, wherein
the buffer layer has a void formed in the buffer layer.

12. The ultraviolet light emitting element according to claim 11, wherein
the void exists in a region of 2 μm from an interface between the sapphire substrate and the buffer layer in a thickness direction of the buffer layer.

13. An ultraviolet light emitting element, comprising:
a sapphire substrate;
an n-type AlGaN layer;
a light emitting layer;
a cap layer;
an electron barrier layer; and
a p-type contact layer including a p-type GaN layer, wherein
the light emitting layer has a multi-quantum well structure,
the multi-quantum well structure includes
a plurality of barrier layers each being a first AlGaN layer and
a plurality of well layers each being a second AlGaN layer, the electron barrier layer includes
at least one first p-type AlGaN layer having an Al composition ratio higher than an Al composition ratio of each of the barrier layers and
at least one second p-type AlGaN layer having an Al composition ratio higher than an Al composition ratio of each of the plurality of well layers and lower than the Al composition ratio of the at least one first p-type AlGaN layer, the at least one first p-type AlGaN layer and the at least one second p-type AlGaN layer contain Mg, the cap layer is located between one well layer of the plurality of well layers of the multi-quantum well structure and the at least one first p-type AlGaN layer, the one well layer being closest to the at least one first p-type AlGaN layer, the cap layer is a third AlGaN layer having an Al composition ratio higher than the Al composition ratio of each of the plurality of well layers and lower than the Al composition ratio of the at least one first p-type AlGaN layer, and the cap layer has a thickness of greater than or equal to 1 nm and less than or equal to 7 nm;

each of the barrier layers has a thickness of greater than or equal to 2 nm and less than or equal to 20 nm, and each of the barrier layers is doped with Si, a concentration of the Si being greater than or equal to $5 \times 10^{17}$ cm$^{-3}$ and less than or equal to $5 \times 10^{18}$ cm$^{-3}$.

14. An electrical device, comprising:
the ultraviolet light emitting element according to claim 1; and
a device body.

15. An electrical device, comprising:
the ultraviolet light emitting element according to claim 2; and
a device body.

16. An electrical device, comprising:
the ultraviolet light emitting element according to claim 7; and
a device body.

17. An electrical device, comprising:
the ultraviolet light emitting element according to claim 13; and
a device body.

* * * * *